United States Patent [19]
Leising et al.

[11] Patent Number: 5,949,188
[45] Date of Patent: Sep. 7, 1999

[54] ELECTROLUMINESCENT DISPLAY DEVICE WITH CONTINUOUS BASE ELECTRODE

[75] Inventors: Günther Leising, Graz; Stefan Hampel, Obdach; Farideh Meghdadi, Graz; Stefan Tasch, Jennersdorf, all of Austria

[73] Assignee: Hage GmbH & Co. KG, Obdach, Austria

[21] Appl. No.: 08/768,495

[22] Filed: Dec. 18, 1996

[51] Int. Cl.$^6$ .................................................. H05B 33/02
[52] U.S. Cl. ........................................... 313/505; 313/500
[58] Field of Search ..................................... 313/462, 465, 313/466, 471, 473, 474, 498, 500, 501, 505

[56] References Cited

U.S. PATENT DOCUMENTS

| | | | |
|---|---|---|---|
| 4,006,383 | 2/1977 | Luo et al. ............................... | 315/169 |
| 4,983,469 | 1/1991 | Huzino et al. .......................... | 428/690 |
| 5,118,987 | 6/1992 | Leksell et al. .......................... | 313/505 |
| 5,206,749 | 4/1993 | Zavracky et al. ....................... | 359/59 |
| 5,276,380 | 1/1994 | Tang ....................................... | 313/504 |
| 5,294,869 | 3/1994 | Tang et al. .............................. | 313/504 |
| 5,294,870 | 3/1994 | Tang et al. .............................. | 313/504 |
| 5,652,067 | 7/1997 | Ito et al. ................................. | 428/690 |
| 5,661,371 | 8/1997 | Salerno et al. ......................... | 315/169.3 |

Primary Examiner—Vip Patel
Assistant Examiner—Matthew J. Gerike
Attorney, Agent, or Firm—Henry M. Feiereisen

[57] ABSTRACT

Electroluminescence color display screen with matrix picture elements (pixels), the display screen comprising a system of single layers applied on top of and partially next to one another, the layer system comprising an insulating, optically at least translucent base layer, a conductive, optically at least translucent base electrode, a patterned electrically insulating intermediate layer, if necessary, one or several color conversion layers applied in form of a matrix and, if necessary, one or several index matching layers, wherein the base electrode is deposited as a continuous layer upon the entire area of the base layer, wherein the insulating intermediate layer encloses and projects past pixel areas made of the organic electroluminescence layer and arranged to form a matrix, and wherein the top electrode applied on top of each pixel area extends partially across the adjacent lattice wall.

14 Claims, 3 Drawing Sheets

FORM LATTICE STRUCTURE → APPLY ACTIVE MATERIAL AND DEM1 → EVAPORATE DEM2 AND PATTERN

FABRICATION STEPS

SECTION A-A

SECTION B-B

ILLUSTRATIONS

Figure 2:
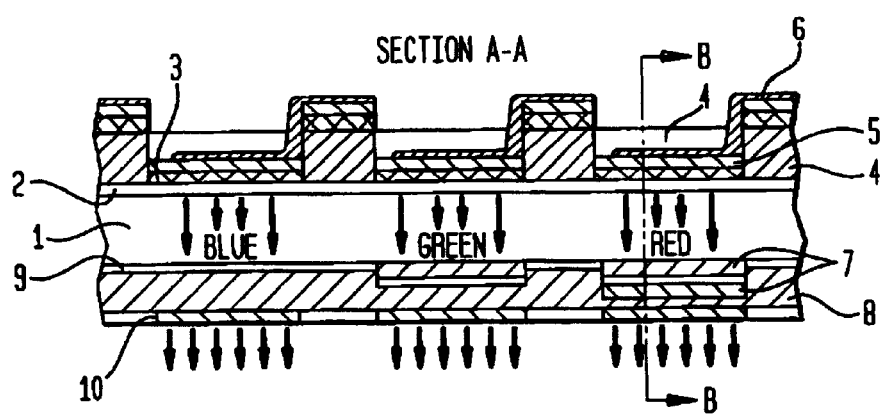

FIG. 2: CONSTRUCTION OF AN ORGANIC LIGHT-EMITTING DIODE. ANODE/ACTIVE LAYER/CATHODE. OPTIONALLY, ADDITIONAL ELECTRON (ETL) AND HOLE (HTL) TRANSPORT LAYERS MAY ALSO BE DISPOSED BETWEEN THE CATHODE AND THE ANODE, RESPECTIVELY, AND THE ACTIVE LAYER.

CHEMICAL STRUCTURE OF (A) OLIGOPHENYLENE n=5-20, (B) SUBSTITUTED OLIGOPHYLENE n=5-20 ($X_1, X_2, Y_1 \ldots _{12}$ -H, -F, -Alkyl, -Cl, -N, -$CF_3$, -CN). (c) CHAIN-LIKE POLY(PARAPHENYLENE) LPPP ($R_1, R_2, R_3$: -Alkyl);

ELECTROLUMINESCENT DISPLAY DEVICE WITH CONTINUOUS BASE ELECTRODE

The invention relates to a electroluminescence color display screen with matrix picture elements (pixels), the display screen comprising a system of single layers disposed on top of and partially next to one another, the layer system comprising an insulating, translucent base layer, a conductive, translucent base electrode layer, a patterned electrically insulating intermediate layer, an organic electroluminescence layer, a top electrode layer, as well as, if necessary, one or several color conversion layers and, if necessary, one or several index matching layers.

Known color display screens of this type have been the center of technological efforts as a result of the increasing demand for small and handy display screens; their fabrication and operation, however, has a number of disadvantages.

For example, the edges of the individual pixels are not exactly defined due to the process used for their manufacturing and there are certain limitations as to the pixel shape. In addition, the relatively high input resistance resulting from the stripe-like layout of the base electrode limits the addressablity of the pixels on each stripe, thereby also limiting the practical size of the linear dimensions of the display screen.

It is therefore an object of the invention to provide a color display screen a with distinctly defined pixel areas which does not impose any limitations on the addressing of specific pixels and which can be fabricated in almost any size.

It is another object of the invention to achieve a small pixel area and to protect the optical layer from the environment.

This is accomplished by the invention in that the base electrode layer is applied on top of the base layer as a continuous layer, that the insulating intermediate layer is applied thereupon as a lattice structure enclosing and projecting past the edges of pixel areas formed by the organic electroluminescence layer and arranged in form of a matrix, and that the top electrode applied onto each pixel area partially extends over the lattice wall by which it is surrounded.

By surrounding the individual pixels with such lattice, the shape of the pixels is well defined, whereby the sharpness of the image may increase significantly. Furthermore, the pixels may also be designed in various different shapes, such as circles and hexagons. The design of the invention also enables a simpler and more flexible addressing of the pixels, since hitherto the number of pixels which could be addressed simultaneously, was limited by the relatively large internal resistance of the conventional electrode stripes. Furthermore, short circuits in the region of the electrode stripes can also be prevented.

In another embodiment of the invention, there may be provided an additional cover electrode layer between the electroluminescence layer and the top electrode layer which extends over the entire pixel area.

This additional cover electrode layer hermetically seals the sensitive electroluminescence layer, thereby eliminating adverse environmental effects.

In another embodiment of the invention, there may be provided one or more spectrally selective mirror or transmission layers for spectrally filtering the light generated in the color conversion layers.

In this way, the spectral purity of the pixels and consequently the color fidelity of the color display screen can be improved.

According to an alternate embodiment of the invention, the base layer may be composed of individual light guides arranged in the emission direction of the light.

A base layer of this type provides a very high transmission of the generated light and is unaffected by the etch solutions and solvents used in the fabrication of a color display screen of the invention.

In addition, a passivating layer may be applied between the color conversion layer(s) and the base electrode layer.

The passivating layer provides an optically neutral equalization of the different thicknesses resulting from the various layer arrangements.

In another embodiment of the invention, the color conversion layers made from fluorescing dyes may be chemically bound as side chains to a backbone polymer.

Dyes of this type provide a particularly high color conversion rate.

According to an alternate embodiment of the invention, the fluorescing dye molecules of the color conversion layers may be embedded therein as a matrix and isolated from each other.

Dyes of this type provide a particularly high color conversion rate.

Most preferably, the organic electroluminescence layer may be made from polyphenylene or oligophenylene, since these materials achieve an especially high brightness and optical efficiency in the blue part of the spectrum.

It has proven to be highly advantageous for fabricating a color display screen according to the invention, if the electrically insulating intermediate layer is made of photoresist, since this arrangement enables etching of very small features in the intermediate layer.

In addition, the organic electroluminescence layer may be made of two or three different electroluminescent materials, wherein the different electroluminescent materials are most preferably made from red-emitting Eu complexes, green-emitting Ga complexes and blue-emitting polyphenylenes or oligophenylenes, since these materials are capable of generating an especially high brightness in their respective wavelength range.

Furthermore, the lattice cells of the intermediate layer may have a rectangular shape which meets the conventional requirements for the pixel area of a color display screen. Alternately, the frame formed by the lattice in the intermediate layer allows the design of quite different shapes.

It is a further object of the invention to provide a method for making an electroluminescence color display screen, where the method for constructing a color display screen according to the invention is rather simple.

This is accomplished by the invention in that the base electrode layer is deposited as a continuous layer over the entire surface of the base layer, that the electrically insulating intermediate layer is deposited on top of the base electrode layer in form of a lattice, such that within each lattice cell of the intermediate layer lattice the base electrode layer does not change the size of a pixel area, that the electroluminescence layer is deposited on top of the pixel areas, whereby the cell walls of the lattice project past and enclose the edges of the electroluminescence layer, that subsequently the additional cover electrode layer is deposited thereupon as a continuous layer by evaporation in the direction normal to the surface of the electroluminescence layer and that thereafter the top electrode layer is deposited thereupon by evaporation in a direction tilted away from the surface normal, wherein the top electrode layer spatially projects past the electroluminescence layer and partially over and to the end face of the respective lattice wall, thereby forming contacts with the electroluminescence layer which are isolated from the adjacent lattice cells.

In this way, exactly defined lattice cells having electroluminescence layers included therein can be formed, wherein the base electrode is formed not in the conventional manner in the form of several parallel stripes, but as a continuous area, so that the input resistance to the individual pixels is reduced accordingly. As a result, limits previously imposed by the electrode stripes are obviated, making it possible to turn on several pixels at the same time without any problem. The method according to the invention provides a significant reduction in the smallest possible pixel area since the pixel area can be distinctly defined by the lattice structure. The additional cover electrode layer makes it possible to encapsulate the electroluminescence layer in the lattice cell, thereby isolating the electroluminescence layer from adverse environmental conditions.

Figure 1:
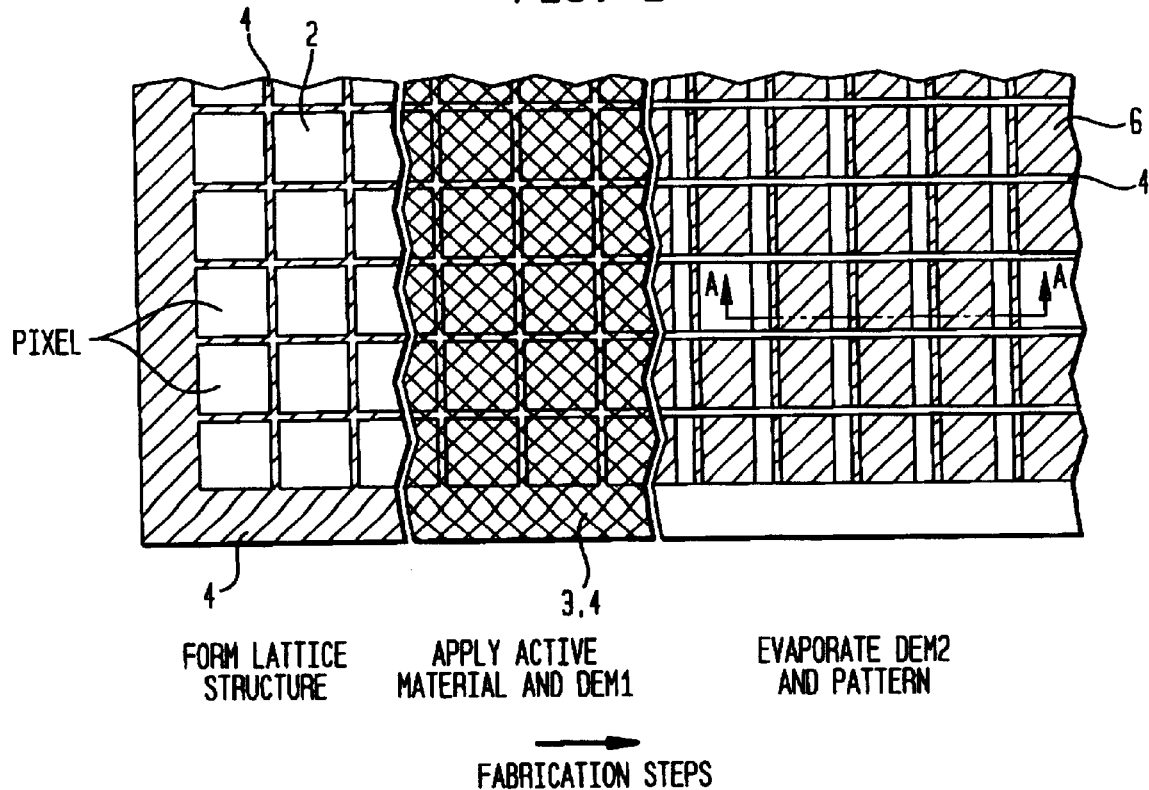
Figure 3:
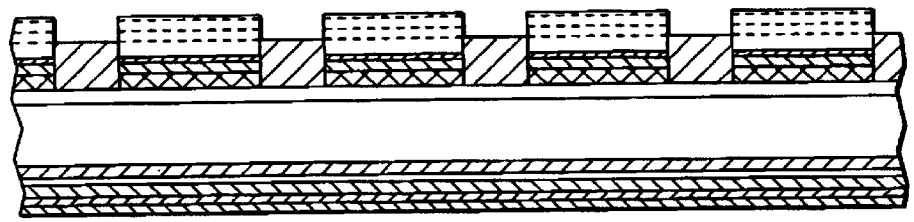
Figure 4:
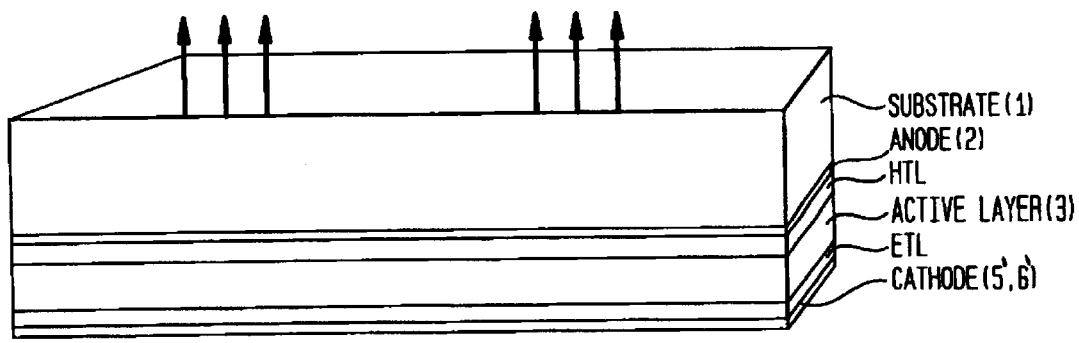
Figure 5A:
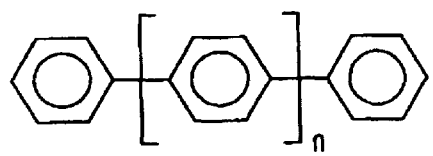
Figure 5B:
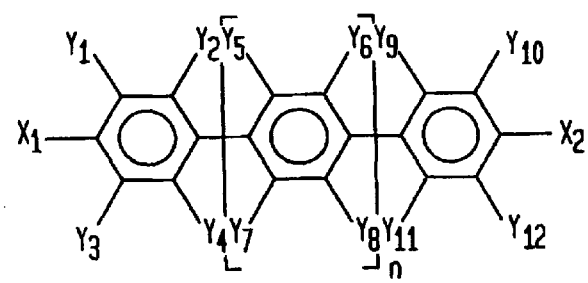
Figure 5C:
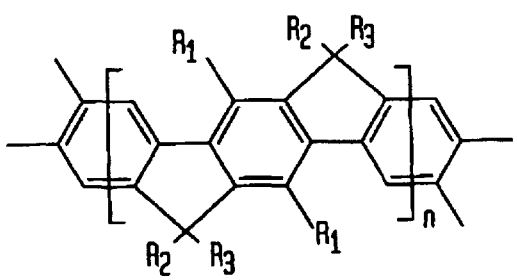

In the following, the invention will be discussed in more detail with reference to the appended drawing. In the drawing is shown in:

FIG. 1 a layout of a color display screen according to the invention;

FIG. 2 a broken-out section through the color display screen of FIG. 1;

FIG. 3 a section through the layout of FIG. 2;

FIG. 4 schematically the construction of an organic electroluminescence diode; and FIG. 5 the structure of blue-emitting organic materials.

In FIG. 2, there is shown an electroluminescence color display screen with matrix pixels, the screen consisting of a system of individual layers applied on top of and partially next to one another. An insulating and translucent base layer 1 forms the basic building block of the color display screen. Disposed on top of the base layer 1 is a conductive, optically transparent, or at least translucent base electrode layer 2, followed by a patterned electrically insulating intermediate layer 4. Between each of these layers, there is disposed an organic electroluminescence layer 3, with each of these layers followed in turn by two top electrode layers 5, 6.

On the opposite side of the base layer 1, there are positioned different fluorescent color conversion layers 7 for converting the color of the radiation generated in the electroluminescence layer 3. For several pixels, the color conversion layers 7 is missing, thereby permitting the generated primary radiation to pass unchanged, whereas in other regions two or more color conversion layers 7 are provided. A protective layer 9 is disposed on the base layer 1 or on top of the color conversion layers 7. This is followed by a passivating layer 8 for evening out the differences in thickness, which is in turn followed by spectrally selective mirror or transmission layers for spectrally filtering the light generated in the color conversion layers.

In order to attain a precisely defined pixel area, the base electrode layer 2 is applied over the entire area of the base layer 1 as a continuous layer and the insulating intermediate layer 4 is applied in form of a lattice, as shown in FIG. 1. In this way, the lattice-like intermediate layer encloses the edges of the pixel areas which are formed by the organic electroluminescence layer 3 generating the light and arranged in the form of a matrix, and projects past these areas.

The top electrode layer 6 applied on top of the pixel area extends partially across and to the end face of the respective lattice wall of the surrounding lattice 4. As seen from FIG. 1, the arrangement of the top electrode layer 6 is chosen in such a way that it provides a connection to the electroluminescence layer 3 while at the same time being insulated from the surrounding lattice cells.

Between the electroluminescence layer 3 and the top electrode layer 6 there is disposed an additional cover electrode layer 5 which hermetically seals the electroluminescence layer 3 and protects it from the environment.

Before explaining the design of the invention in further detail, the principle of electroluminescence on which the invention is based shall be discussed further with reference to FIG. 4.

An organic luminescent diode basically comprises an organic layer 3' disposed between two electrodes 2', 5', 6'. By applying a voltage to the electrodes 5', 6', electrons are injected from the cathode 5', 6' and holes are injected from the anode 2' into the active organic layer 3'. The charge carriers having an opposite charge drift in opposite directions under the applied electric field and can thereby interact in the layer to form excited states. The excited states can return to the ground state by emitting radiation, thereby generating electroluminescence light. In order to accomplish this efficiently, the work function of each of the electrodes has to closely match the upper edge of the valence band and the lower edge of the conduction band, respectively, of the active layer.

In order to provide the most efficient electron injection from the cathode, the cathode material should have a good conductivity and a work function adapted to the active medium which should be as small as possible (<4–4.5 eV). Since materials with a small work function are usually very reactive, for example alkali and alkaline earth metals, a high environmental stability of the cathode materials is usually required. Some materials suitable as cathode materials are, for example, Al, Ag, Mg, Ca, In and alloys of these materials.

In order to provide the most efficient hole injection from the anode, the anode material should have a good conductivity and a work function which should be as large as possible (>4–4.5 eV). Some materials suitable as anode materials are, for example, Au, Pt and Cu. In addition, degenerate semiconductors obtained by doping, such as indium tin oxide (ITO), doped zinc oxides, indium oxide and other doped semiconductors with a large bandgap as well as doped layers of conjugate polymers, such as doped polyaniline, may be used. The latter materials have the advantage over metal electrodes that they are highly transparent in the visible spectral region. This is important since the light generated in the active medium of the light emitting diode is emitted through the electrodes of the device, requiring the lowest possible losses. For this reason, (at least) one of the two electrodes has to be transparent or at least semitransparent. Usually the anode is transparent or semitransparent, but the cathode may also be made semitransparent.

In the simplest case, the electroluminescence layer consists of a single organic light-emitting layer. This layer should have good transport properties for electric carriers, a high photoluminescence quantum yield and a small concentration of defects. Light-emitting diodes emitting in the blue are especially interesting since the blue light may be used for exciting color dyes whereby the blue light can be converted into green and red light. Organic materials which are chemically similar to the oligophenylenes and the polyphenylenes, have proven to be especially suitable for applications for blue LED's (FIG. 5).

The devices may be improved significantly by using additional charge transport layers between the active layer and the electrodes, as shown in FIG. 4. The reason therefor is that the intermediate layers isolate the excited states from the electrodes, thereby reducing the quenching of the luminescence at defect sites preferably occurring near the electrodes. In addition, the introduction of special charge transport layers improves the efficiency and lifetime of the devices.

A charge transport layer disposed between the active layer and the cathode and having a high electron mobility, but only a limited hole mobility, is called an electron transport layer (ETL). The electron injection into the active layer may be significantly improved by an ETL layer if the LUMO-CB (lowest unoccupied molecular state) of the ETL layer is positioned below the conduction band of the active layer, but above the Fermi level of the cathode. Consequently, the electron injection can be controlled by the ETL, so that the number of injected electrons matches the number of injected holes, thereby significantly improving the efficiency of the device. The efficiency of the device may be improved further by positioning the HOMO-VB (highest occupied molecular state) of the ETL layer below the valence band of the active layer. In this case, the electrons and holes are localized at the ETL/active layer interface and are therefore better able to interact and the excited states are formed more efficiently.

A charge transport layer disposed between the active layer and the anode and having a high hole mobility, but only a limited electron mobility, is called a hole transport layer (HTL). The hole injection into the active layer may be significantly improved by an HTL layer if the HOMO-VB of the HTL layer is positioned below the Fermi level of the anode, but above the valence band of the active layer. In this way, the field strength during operation can be reduced and the lifetime of the devices increased.

All the other colors can be generated from blue light, since blue has the highest energy of all spectral colors. If a color dye which emits green, is irradiated with blue light, then the green dye is excited by the blue light and subsequently emits green light. Consequently, the light is converted from a color having a higher energy into a color having a lower energy—this process is the underlying principle of photoluminescence.

This effect can also be used for converting light from a blue emitting organic light-emitting diode into other colors. If the blue diode is covered by one or more different color dye(s), then all visible colors, including infrared, can be generated.

By covering a blue parahexaphenyl (PHP) light-emitting diode with a layer of a Coumarin 102 dye in a polymethacrylate (PMMA) matrix, the blue light of the PHP diode is converted in green light emission. In this process, green light is generated which to the human eye appears three times as bright as the exciting blue light since the human eye is much more sensitive in the green spectral region. The quantum conversion yield from blue into green is here approximately 40%. If the dye layer is deposited directly onto the electroluminescence device without an intervening layer of air, then the quantum conversion yield can be increased to 90% by minimizing waveguiding effects between the layers. It is more difficult to generate red emission colors by using blue light, since most color dyes emitting in the red have only a small absorption in the blue and can, as a result, not be excited efficiently with blue light. For this reason, a red color dye may be coupled with a green dye for achieving the color conversion blue→green→red.

For example, by covering a PHP diode first with a Coumarin 102/P layer followed by a layer of a color dye Lumogen F300 in PMMA, red light is generated. In this case, the quantum conversion yield blue→red is approximately 10% if the layers are disposed on top of each other without index matching, or 40% if the layers are disposed directly on top of each other (without intervening layer of air).

The primary colors red-green-blue of a color display screen have to be spectrally very pure in order for the colors to attain every color mix. Since the distribution of the spectral emission of organic molecules and molecular compounds is often very broad, the emission colors in most cases will have to be especially conditioned so that they can attain spectral purity. Spectral filtering is particularly essential with the aforedescribed color conversion technique, if the light emitted from the dye layer is broadened by a contribution which is not absorbed in the color dye.

For spectrally filtering the light, an absorption filter may be used which absorbs all portions with the exception of the desired emission wavelengths. This method has the disadvantage that the light energy outside the desired emission wavelength range is converted into heat in the absorption filter. The method used below for subsequently spectrally filtering the emission colors, is based on a non-absorbing dielectric band path mirror/transmitter. This dielectric mirror/transmitter comprises several layers of materials with alternating high and low refractive index (e.g. $TiO_2$, refractive index n=2.1) and $MgF_2$ (n=1.3). The mirror/transmitter has a high transmission in the desired emission range (T>80%) and a high reflection in the remaining spectral range (R>85%). Consequently, the light can only pass through the filter in the spectral range where the mirror/transmitter is highly transparent while the remaining light is reflected back. The portion of the reflected light having a high energy is consequently reflected back and forth between the spectrally selective mirror/transmitter and the base electrode until it is absorbed and converted by the color dye layers. Spectral filtering can thus be accomplished with a minimum loss of energy with the help of the spectrally selective mirror/transmitter.

Generally, organic color dyes with a high photoluminescence quantum yield are used as color converters. For the fabrication of homogeneous layers, the color dyes are embedded in a polymer matrix (e.g. PMMA, polystyrene . . . ). As discussed above, the color converting layers must have a high optical density so that the exciting light is completely absorbed in the layer. The optical density of the color converting layer increases with the color dye concentration in the polymer matrix. With increasing color dye concentration in the polymer matrix, however, the probability for the color dyes to form aggregates also increases, resulting in a dramatic decrease of the PLQA of the dyes. This concentration effect can be prevented while still achieving the required optical density if the thickness of the color converting layers is increased accordingly. However, thick color conversion layers may adversely affect the resolution which has to be taken into account in the design of the display screen. It may also be possible to minimize the formation of aggregates without increasing the thickness of the color converting layers, for example, by binding the dye molecules to the polymers in the form of side chains. These side chain polymers make it possible to obtain very thin layers with a high optical density and a high PLQA. The formation of aggregates can also be minimized by arranging the color dyes in a special crystalline (e.g. lyotropic) matrix wherein the color dye molecules are isolated from each other. In matrices where the color dye molecules are arranged in perpendicular cylindrical structures embedded in the matrix, the emission is more directional than in an isotropic polymer matrix, and such matrices therefore enhance the resolution.

A method for making a color display screen of the invention will be described in greater detail with reference to FIGS. 1 and 2.

The base electrode layer 2 is initially deposited as a continuous layer upon the entire area of the base layer 1.

This process is preferably carried out by evaporating the optically at least translucent, conductive base electrode layer 2. The requirements for the materials used therefor are as follows:

1) Optical transparency of almost 100%
2) Relatively good conductivity (small specific resistivity)
3) Suitable work function
4) Resistance against thermal and mechanical stress These requirements are met by the preferred material indium oxide $In_2O_3$. The base electrode layer 2 is evaporated onto the entire area of the base layer 1 as a continuous and homogeneous layer and contacted at the edges. The layer thickness may preferably lie within a range of up to 1 μm.

The electrically insulating intermediate layer 4 is disposed on the base electrode layer 2 in form of a lattice wherein the rectangular shape shown in FIG. 1 may also have other geometrical shapes, such as circles or hexagons. Within each lattice cell of the intermediate layer lattice 4, the base electrode layer 2 maintains the size of a pixel area. As material for the intermediate layer lattice, a photoresist varnish may be employed which is preferably deposited over the base electrode with a thickness of up to 20 μm and patterned in a lattice-like fashion by a photolithographic process, with the exposure being performed by various methods. Holographic gratings are generated in a similar fashion. Any other dielectric may be employed as an intermediate layer instead of the photoresist varnish.

The exposed areas corresponding to the pixel areas are etched off, leaving a lattice-like system of walls (up to 20 μm high) with a bottom which comprises the base electrode 2 and is resistant to chemical etching.

Subsequently, the optically active electroluminescence layer 3 is deposited which may consist of individual or a combination of different electroluminescent materials.

Depending on the active material employed, the materials are deposited either by evaporation or by spin-coating wherein the layer thickness of the entire active package in a preferred embodiment of the invention may reach 1 μm. The electroluminescence layer 3 is patterned in the shape of rectangular pixels by placing it upon the lattice-like intermediate layer structure 4, whereby the lattice cell walls 4 protrude over the electroluminescence layer 3 and enclose the edges thereof.

At this point, an additional cover electrode layer 5 is deposited on the entire layout in the direction normal to the electroluminescence layer 3—i.e. untilted -, with this process preferably being carried out by evaporation.

The materials usable as cover electrode layer are selected for good conductivity, good work function as well as for their reflectivity. Different materials and combinations of materials with a layer thickness of up to 1 μm may be employed.

Preferably, a conductive material having a small work function, for example Al or Ca, is used which is evaporated uniformly over the electroluminescence layer, completely covering the electroluminescence layer.

Subsequently, a top electrode layer 6 is deposited by evaporation in a direction tilted from the normal to the base layer, the top electrode layer 6 covering the electroluminescence layer and partially covering the respective lattice wall to its end face, thereby providing contacts to the electroluminescence layer which are isolated from the adjacent lattice cells.

A material suitable for the top electrode layer 6 would be a conductive, hard and scratch-resistant metal capable of being, for example, sputtered. However, the top electrode layer 6 as well as the other additional cover electrode layer 5 may be formed from the same material.

For depositing the top electrode layer 6, the basic display screen structure is tilted by a certain angle with respect to the evaporation source and the top electrode material is deposited. This tilting provides—at a well defined location a connection between the top electrode layer 6 and the electroluminescence layer 3 disposed within the lattice-like structure, with the additional cover electrode layer 5 disposed therebetween.

For electrically isolating the individual lattice cells, photoresist is deposited on top of the evaporated top electrode layer 6 and exposed through a suitable mask along a section of the lattice walls 4 perpendicular to the contacted lattice walls. The exposed sections of the lattice walls are etched away, together with the two top electrode layers 5, 6 underneath and the electroluminescence layer 3 also located in these areas, whereafter the remaining photoresist is rinsed off.

The result is a checkerboard-like distribution of pixels, all of which are provided with contact areas formed by the remaining top electrode layers 6 on the respective lattice walls.

On the side of the base layer 1 facing away from the intermediate lattice layer through which the light generated in the electroluminescence layer 3 of each lattice cell is transmitted, the generated light is conditioned for the color display screen. In the event that only one electroluminescence material is employed, different color conversion layers 7 are deposited for the purpose of forming elements comprising pixels with the primary colors blue, green and red (FIG. 2) which are known to be capable of forming all the other colors.

The materials suitable as color conversion layers have to absorb the incident monochromatic radiation in a specified wavelength range and emit in a suitable wavelength range and must achieve a high fluorescence quantum efficiency (>90% in dilute solutions), whereby single layers as well as sandwich structures may be employed.

The layers capable of generating the primary colors may be deposited by the following methods:

The fluorescence layer 7 absorbing in the blue spectral range and emitting in the green spectral range is either applied on the entire base layer 1 and subsequently patterned in a way that only those pixels are exposed which are intended to emit in the blue, or the layer is already patterned accordingly.

Subsequently, the highly transparent protective layer 9 is applied on top of this patterned area and another fluorescence layer 7 absorbing in the green spectral range and emitting in the red spectral range is patterned. Application of the passivating layer 8 provides a smooth surface, while simultaneously providing thermal insulation of the fluorescence layers 7. Finally, spectrally selective mirror/transmitter layers 10 adapted for the three primary colors are patterned across all light-emitting pixels for filtering the emitted light.

The spectrally selective mirror/transmitter layers 10 may also be patterned on the top surface of a highly transparent foil. In this case, the fluorescence structure described above and comprising the fluorescence layers and the highly transparent protective layer is deposited on the underside of the foil.

It has proven to be advantageous to use a combination of the two aforedescribed methods, as illustrated in the following example:

The spectrally selective mirror/transmitter layers is patterned onto the top surface of a highly transparent foil. The fluorescence layer absorbing in the green and emitting in the red is deposited on the underside of that foil. The fluorescence layer absorbing in the blue and emitting in the green is fabricated on the base layer 1, the highly transparent protective layer can be inserted at a location where it provides the best performance.

The contact areas of the display screen are the lattice walls covered with the top electrode layer 6. A printed circuit board is patterned in conformance with the contact areas, then properly positioned above the display screen and mechanically attached to the base layer. Since the top electrode layer 6 consists of a very hard material, there is very little danger that the top electrode layer 6 is destroyed as a result of scratches. The mechanical stress introduced by the bonding with the base layer 1 is completely absorbed by the stable lattice walls 4, so that no adverse effects leading to a deterioration of the electroluminescence layer 3 are expected.

The electrical leads are secured to the backside of the printed circuit board. The number of contacts is larger than for the conventional X-Y addressing of a matrix screen; on the other hand, the contacts are completely independent from each other. The materials used for the electroluminescence layer are materials capable of emitting in one of the primary colors red, green and blue. Ga metal complexes can, for example, be employed to achieve green emission, Eu metal complexes can be employed to achieve red emission.

As discussed above, the electroluminescence layer 3 may also consist of a combination of several materials, wherein each of the three active materials has to be patterned. The top electrode can be patterned and contacted as described in the foregoing, color conversion layers, however, are not required. Optionally, a spectrally selective mirror/transmitter may be patterned accordingly, which may be applied either on the side facing the lattice or on the side facing away from the lattice. Here, too, a passivating layer is provided between the selective mirror/transmitter and the optically translucent electrode layer.

We claim:

1. An electroluminescent display device comprising:
    a continuous translucent base layer;
    a continuous electrically conducting first electrode layer disposed on said base layer;
    an electrically insulating intermediate layer disposed on said first electrode layer and defining a two-dimensional wall pattern, said wall pattern comprising contiguous intersecting wall sections enclosing individual pixel openings which extend to the first electrode layer, but are laterally separated from each other by said wall sections;
    an organic electroluminescent layer disposed on said first electrode layer and laterally confined in said pixel openings so as to form electroluminescent pixels; and
    an electrically conducting second electrode layer disposed on said electroluminescent pixels and laterally extending over only a portion of the wall section which encloses each of said electroluminescent pixels,
    wherein the second electrode layer forms individual contact elements, with each contact element corresponding to and electrically contacting a respective electroluminescent pixel without making electrical contact to any of the adjacent electroluminescent pixels.

2. The electroluminescent display device of claim 1, further comprising at least one color conversion layer which is patterned so as to match a pattern of the electroluminescent pixels.

3. The electroluminescent display device of claim 2, wherein the at least one color conversion layer comprises fluorescent dye molecules which are chemically bound to a carrier polymer in the form of side chains.

4. The electroluminescent display device of claim 3, wherein the fluorescent color dye molecules of the color conversion layer are isolated from each other in a matrix.

5. The electroluminescent display device of claim 1, further comprising a cover electrode layer disposed between the electroluminescent layer and the second electrode layer.

6. The electroluminescent display device of claim 2, further comprising at least one spectral filter layer for spectrally purifying the light generated in said at least one color conversion layer.

7. The electroluminescent display device of claim 1, wherein the base layer comprises individual light guides to direct the light generated in the device.

8. The electroluminescent display device of claim 2, further comprising a passivating layer disposed between the color conversion layer and the spectral filter layer.

9. The electroluminescent display device of claim 1, wherein the organic electroluminescent layer comprises a blue light-emitting material selected from the group consisting of polyphenylenes and oligophenylenes.

10. The electroluminescent display device of claim 1, wherein the intermediate layer comprises photoresist.

11. The electroluminescent display device of claim 1, wherein the organic electroluminescent layer comprises two different electroluminescent materials.

12. The electroluminescent display device of claim 1, wherein the organic electroluminescent layer comprises at most three different electroluminescent materials.

13. The electroluminescent display device of claim 12, wherein the different electroluminescent materials comprise red-emitting Eu complexes, green-emitting Ga complexes and a blue light-emitting material selected from the group consisting of polyphenylenes and oligophenylenes.

14. The electroluminescent display device of claim 1, wherein said pixel openings have a rectangular shape.

* * * * *